United States Patent
Hausmann

[11] Patent Number: 6,099,697
[45] Date of Patent: Aug. 8, 2000

[54] METHOD OF AND APPARATUS FOR RESTORING A SUPPORT SURFACE IN A SEMICONDUCTOR WAFER PROCESSING SYSTEM

[75] Inventor: Gilbert Hausmann, Ben Lomond, Calif.

[73] Assignee: Applied Materials, Inc., Santa Clara, Calif.

[21] Appl. No.: 09/290,621

[22] Filed: Apr. 13, 1999

[51] Int. Cl.[7] .............. H01L 21/00; H05F 3/00; B25B 11/00; H02N 13/00; C23C 14/00

[52] U.S. Cl. ............. 204/192.12; 204/298.15; 204/298.01; 204/298.02; 204/298.06; 204/192.1; 361/234; 361/235; 361/213; 361/220; 361/230; 361/212; 438/716; 118/728

[58] Field of Search .............. 204/298.15, 192.32, 204/298.01, 298.02, 298.31, 298.34, 298.06, 192.1, 192.12, 192.33; 361/234, 235, 213, 220, 230, 212; 279/128; 438/716; 118/728; 156/272.2

[56] References Cited

U.S. PATENT DOCUMENTS

| | | |
|---|---|---|
| 5,221,450 | 6/1993 | Hattori et al. ............ 204/192.32 |
| 5,310,453 | 5/1994 | Fukasawa et al. ............ 438/716 |
| 5,315,473 | 5/1994 | Collins et al. ............ 361/234 |
| 5,325,261 | 6/1994 | Horwitz ............ 361/234 |
| 5,459,632 | 10/1995 | Birang et al. ............ 361/234 |
| 5,552,955 | 9/1996 | Mashiro et al. ............ 361/234 |
| 5,573,981 | 11/1996 | Sato ............ 438/778 |
| 5,880,924 | 3/1999 | Kumar et al. ............ 361/234 |

*Primary Examiner*—Alan Diamond
*Attorney, Agent, or Firm*—Thomason, Moser & Patterson

[57] ABSTRACT

Method and apparatus for restoring a support surface of a substrate support to a pre-process condition. The method comprises the steps of providing a surrogate substrate on the degraded support surface, providing the surrogate substrate with a ground connection and establishing an electric field between the support surface and the surrogate substrate to remove accumulated charges in the support surface. The apparatus comprises a process chamber having a surrogate substrate on a the support surface and connected to ground. The surrogate substrate is a semiconductor wafer or a plate or sheet of metallic material. The ground connection is established by striking a plasma that contacts the surrogate substrate and an electrical ground reference. The electric field established between the support surface and the surrogate substrate "pushes" any accumulated charges out of the support surface. Removal of the accumulated charges improves and extends the chucking ability of the support surface. The subject method also maintains the integrity of the support surface material as it is not attacked by highly energized and/or reactive species in a plasma.

22 Claims, 4 Drawing Sheets

METHOD OF AND APPARATUS FOR RESTORING A SUPPORT SURFACE IN A SEMICONDUCTOR WAFER PROCESSING SYSTEM

BACKGROUND OF THE INVENTION

1. Field of the Invention

The invention relates generally to a method and apparatus for restoring a workpiece support surface in a semiconductor wafer processing system to a pre-process condition and, more specifically, to reducing the accumulated charges on the workpiece support surface.

2. Description of the Background Art

Electrostatic chucks are used for retaining a workpiece in a variety of applications including securing a substrate (i.e., a semiconductor wafer) within a semiconductor wafer process chamber. Although electrostatic chucks vary in design, they all are based on the principle of applying a voltage to one or more electrodes in the chuck so as to induce opposite polarity charges in the workpiece and electrodes, respectively. The electrostatic attractive force between the opposite charges presses the workpiece against the chuck, thereby retaining the workpiece.

In semiconductor wafer processing equipment, electrostatic chucks are used for securing or clamping wafers to a pedestal located within the process chamber. The pedestal is provided with additional equipment, e.g., heaters, heat sinks, heat transfer gas ports, additional electrodes and the like to regulate temperature, electrical bias and other chamber conditions during wafer processing to optimize yield. In certain types of chambers, for example an inductively coupled plasma source (IPS) sputter etch chamber, a plasma is used to initiate wafer processing conditions. In such chambers, the pedestal also functions as a RF powered cathode. An RF powered anode is typically the chamber walls. An additional coil on the outside surface of the chamber lid is energized with RF power that inductively couples through the lid (the lid being a dielectric, such as quartz) and into the chamber. The electric field generated between the anode and cathode along with the inductively coupled power from coil ionizes a reactant gas introduced into the chamber to produce the plasma. The plasma, characterized by a visible glow, is a mixture of positive and negative reactant gas ions, neutrals and electrons. Ions from the plasma bombard the wafer to create (etch) a desired pattern.

Electrically biasing the pedestal and wafer as a cathode enhances the wafer process; however, it also creates certain undesirable conditions afterwards. Particularly, charges accumulate on the dielectric support surface of the electrostatic chuck. The source of these charges is primarily ionization of a backside gas. Backside gas (or heat transfer gas) is pumped through the pedestal to heat transfer gas ports in the support surface to be maintained between the support and the wafer. This gas transfers heat between the wafer and the support to maintain uniform temperature conditions across the entire backside of the wafer as it is clamped to the support surface. However, if the backside gas becomes ionized, some of the electrons are attracted to and ultimately accumulate on the support surface (e.g., the electrostatic chuck) due to the bias on the pedestal. Other sources of accumulated charges are stray ions from the plasma that are erroneously deposited on the edges of the electrostatic chuck or the field emission effect which pulls charges from the backside of the wafer to the support surface.

Accumulated charges are detrimental because they reduce the available chucking force for retaining a wafer on the support surface. This condition, in turn, results in poor process conditions. For example, a reduced chucking force can contribute to a non-uniform backside gas pressure under the wafer. Such unequal forces cause wafer shifting or pop-off and compromise temperature control which results in poor etch process conditions or particle contamination. Additionally, during the course of batch processing, it becomes increasingly difficult to dechuck a processed wafer due to the buildup of accumulated electrostatic charges in the support surface. As such, it is necessary to provide methods for eliminating these accumulated charges.

Various methods for removing charges from support surfaces are available and known in the prior art. The simplest method is to switch off the power to chucking electrodes, and/or ground the chucking electrodes. However, this method is also the least effective because the residual charges do not conduct through the dielectric to the electrodes. Instead, these residual charges remain on the support surface. Mechanical wiping is a second method of charge removal. However, this solution requires additional machinery be incorporated into the process chamber which can be costly and increase the frequency of maintenance cycles for repairs, adjustments and the like.

Plasma post-processing the chuck surface is a recognized solution and involves exposing the support surface to a highly energetic plasma after the wafer has been removed. The mechanism by which the plasma works though is not totally understood. One school of thought is that the plasma provides an electrical return path for the accumulated charges to drain. Yet another school of thought is that the plasma physically bombards the support surface to loosen the accumulated charges. Either way, the plasma removes accumulated charges from the support surface. Invariably, the plasma also attacks and deteriorates the material of which the support surface is made. Prolonged or repeated plasma treatment therefore shortens the lifespan of the chuck. Additionally, after repeated bombardment, charges from the plasma can also accumulate on the support surface. Currently practiced methods of surface charge removal do not adequately restore the support surface to a preprocess, i.e., discharged or neutral, condition without damaging or shortening the lifespan of the electrostatic chuck.

Therefore, there is a need in the art for an improved method for removing residual charges from the support surface of an electrostatic chuck that restores the support surface to preprocess conditions without reducing chuck performance or lifespan.

SUMMARY OF THE INVENTION

The disadvantages associated with the prior art are overcome by a method and apparatus for restoring a support surface of a substrate support. The method comprises the steps of providing a surrogate substrate on the effected or otherwise degraded support surface, providing the surrogate substrate with a ground connection and providing a force between the support surface and the surrogate substrate to remove accumulated charges in the support surface. The surrogate substrate is a semiconductor wafer or a plate or sheet of conductive or semiconductive material connected to ground. In one embodiment, the ground connection is established by striking a plasma that connects the surrogate substrate to an electrical ground reference. In another embodiment, the ground connection is established by a conductive wire attached to the surrogate substrate and an electrical ground reference.

The force between the support surface and the surrogate substrate is created by energizing a power source connected to the substrate support to establish an electric field between the support surface and the surrogate substrate. The power source is capable of delivering a voltage in the range of approximately 2–5 KVDC. This voltage can be delivered steadily or pulsed for a specific length of time (approximately three minutes).

The described restoration process removes charges that accumulate on the support surface to due a variety of wafer process conditions. The electric field established between the support surface and the surrogate substrate "pushes" any accumulated charges off of the support surface. Removal of the accumulated charges improves and extends the chucking ability of the support surface. The subject method also maintains the integrity of the support surface material as it is not attacked by highly energized and/or reactive species in a plasma.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

Figure 2:
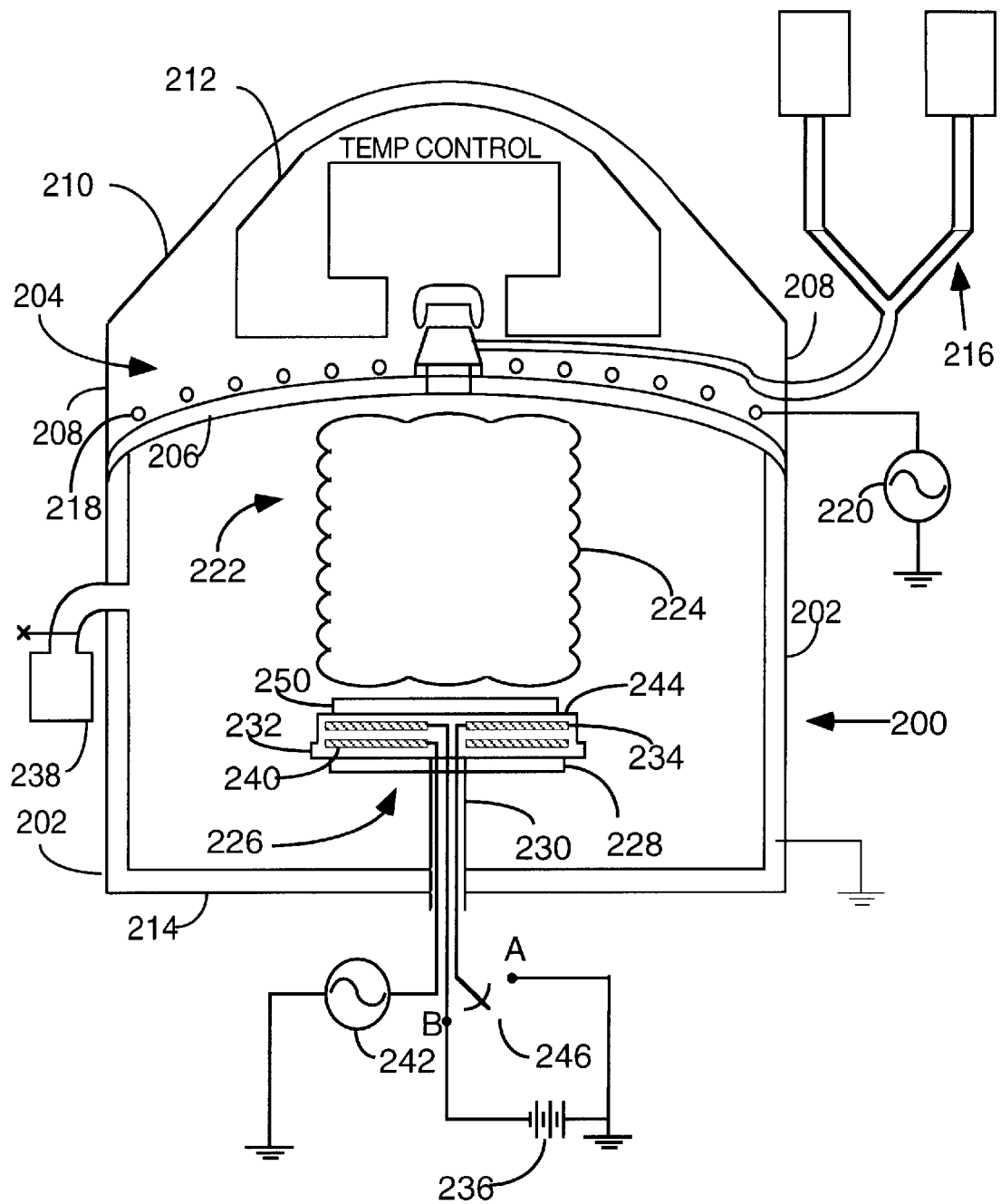
FIG. 2 is a partial cross-sectional view of a chamber employing the method shown in FIG. 1.

FIG. 2 depicts a cross-sectional view of a process chamber 200 which is part of a wafer processing system (not shown)for processing substrates such as a semiconductor wafer 250. The chamber is typically enclosed by sidewalls 202 and a lid 206. A bottom 214 joins the sidewalls 202 to form the complete chamber 200. The sidewalls 202 are often formed of a metal of sufficient strength and thickness so as to allow a high vacuum (milliTorr range) to be produced within. Examples of such metals are stainless steel or aluminum. The lid 206 is dome-shaped and forms the bottom surface of an additional enclosure 204 disposed above the chamber 200. Specifically, the enclosure 204 is defined by enclosure sidewalls 208 rising up from the lid 206 in alignment with chamber sidewalls 202, cover 210 above the enclosure sidewalls 210 and the lid 206.

Within the enclosure 204 is one or more apparatus that assist with wafer processing functions including but not limited to a temperature control apparatus 212 and process monitoring apparatus 216. An example of a suitable temperature control apparatus is described in U.S. patent application Ser. No. 08/947,174 filed Oct. 8, 1997 and an example of a suitable process monitoring apparatus is described in U.S. patent application Ser. No. 08/944,240 filed Oct. 6, 1997. Additionally within the enclosure 204 is an RF antenna 218. The RF antenna 218 is disposed on top of the lid 206 in a coiled manner and is connected to a first RF power source 220.

A pedestal assembly 226 in the chamber 200 supports the wafer 250 during processing. Specifically, the pedestal assembly 226 comprises a shaft 230 passing vertically through the bottom 214 of the chamber 200, a pedestal base 228 supported by the shaft 230, and an electrostatic chuck 232 supported by the pedestal base 228. The electrostatic chuck 232 has one or more chucking electrodes 234 provided within an insulating material on top of or within the electrostatic chuck. For example, in a preferred embodiment of the invention the chucking electrode(s) 234 can be a conducting material such as a thin copper layer sealed in polyimide and adhered to the electrostatic chuck 232. The chucking electrodes 234 are energized by a voltage source which may be power supply 236 or an alternate power supply not shown. A potential difference established between the chucking electrodes 234 and the wafer 250 attracts and electrostatically clamps the wafer 250 to a support surface 244 of the electrostatic chuck 232. In a preferred embodiment of the invention, the chucking electrodes 234 are oriented in a bipolar configuration with an applied potential difference in the range of approximately 200–2000 VDC. Specifically, for a bipolar configuration, the electrodes 234 are connected to the power source 236 through switch 246 in the "A" position so that there is an equal and opposite bias on each of the electrodes 234. Switch 246 also has a "B" position for connecting the electrodes in a monopolar configuration for surface treatment which is explained in greater detail below.

Another electrode 240, acts as an additional cathode for conducting additional electrical power during wafer processing. Alternately, the entire pedestal assembly 226 functions as a cathode. Electrode 240 (or pedestal assembly 226) is electrically connected to a second RF power source 242. The second RF power source 242 provides electrical power necessary to bias the wafer 250 to improve processing.

In operation, a process gas is provided in a reaction zone 222 via a process gas supply 238 outside the chamber 200 and the first RF power source 220 energizes the RF antenna 218. The power from the antenna 218 inductively couples through the lid 206 (which is fabricated of a suitable material for inductive energy transfer such as quartz) to ionize and accelerate process gas molecules in the chamber 200 into a plasma 224.

During wafer processing (for example, an etch process) a desired integrated circuit pattern, portion thereof or the like is formed on the wafer 250. During the etch process, the charge accumulation phenomenon previously described occurs. Each of the accumulated charges has a binding energy associated with it. This binding energy must be overcome in order to remove the charge from the support surface 244. After a processed wafer has been "dechucked" and removed from the electrostatic chuck 232, a determination can be made as to whether a surface restoration process is to be performed i.e., an undue amount of residual charges have accumulated on the support surface 244. This determination can be based on a variety of measurements and/or dechucking methods that are known in the prior art and include but are not limited to lift pin force, backside gas pressure or "flow burp" phenomenon, current detection and the like. For example, as lift pins under the electrostatic chuck are actuated to lift the wafer off the support surface 244, the force required by the pins to break contact between the wafer and support surface can be monitored. Additionally, the flow of heat transfer gas between the wafer and support surface can be monitored. If a sudden drop if pressure (or burp) occurs, this is an indication that the electrostatic force pulling down on the wafer is less than the pressure of the gas pushing up on the wafer. Excessive force by the lift pins or sudden and large heat transfer pressure differentials can damage or break a wafer. If analysis of any such parameters conclude that the condition of the support surface has degenerated to an extent as to inhibit proper operation, the following method describes the steps necessary to restore the support surface and allow for proper chuck operation.

In a preferred embodiment of the invention, the backside gas pressure applied to the wafer is monitored. Ideally, a backside gas is flowed between the wafer 250 and support surface 244 to act as a thermal transfer medium. Normal operating pressure is approximately 4 Torr. Since this backside gas pressure would move or pop the wafer off the support surface 244 if there was not an equal and opposite chucking force pulling the wafer down, backside gas pressure can be correlated to chucking force. A backside gas pressure of 4 Torr is approximately equal to a chucking force of approximately 3.8 lbs. If the chucking force degrades below the required minimum value to retain the wafer as a result of the accumulated charges, wafer movement or anomalous or erratic backside gas pressure readings indicative of venting of such gas into the chamber are detected which will indicated that the support surface treatment method (explained in greater detail below) must be started.

Figure 1:
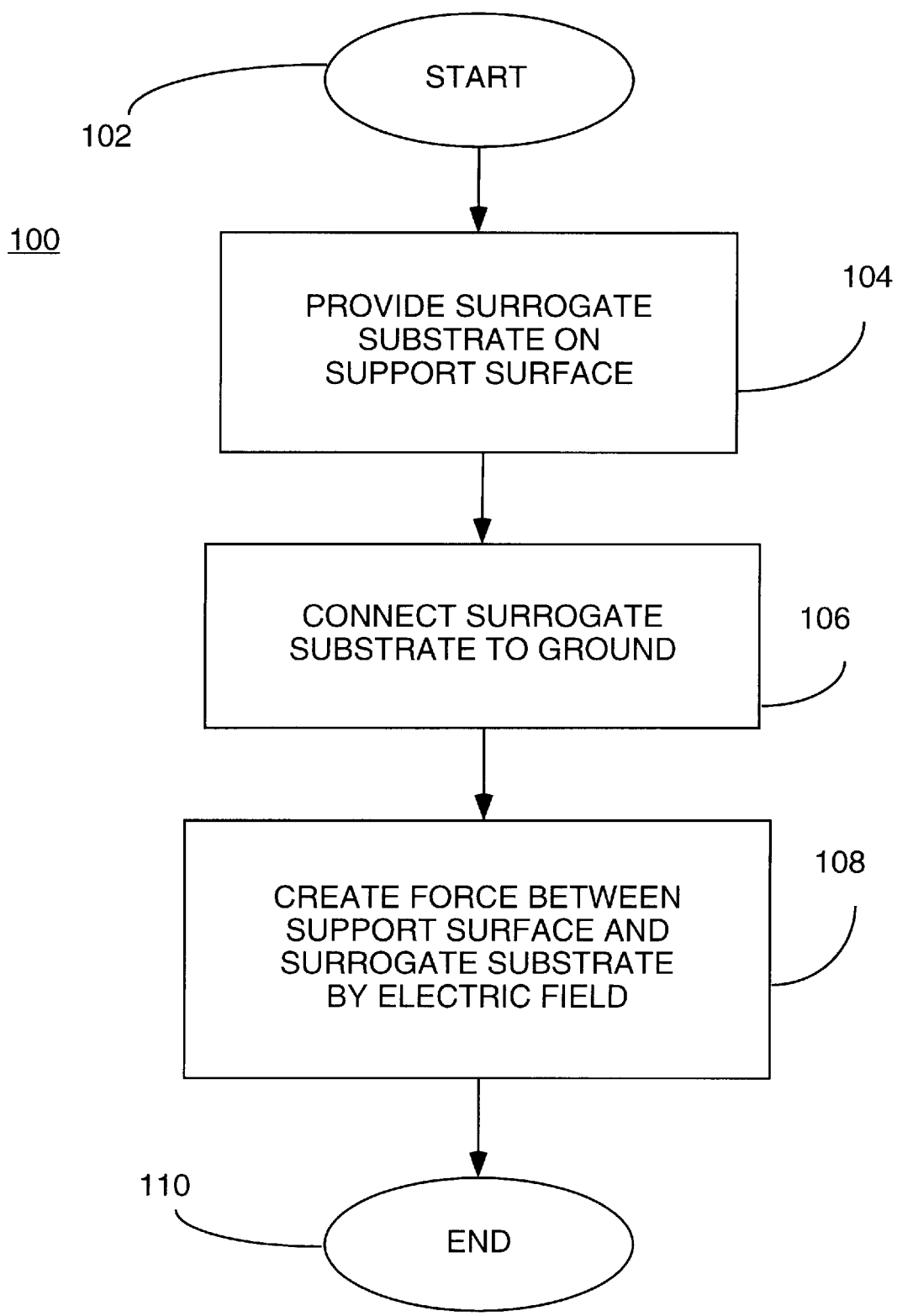
FIG. 1 is a flowchart depicting the steps for implementing a method of the subject invention.
Figure 3:
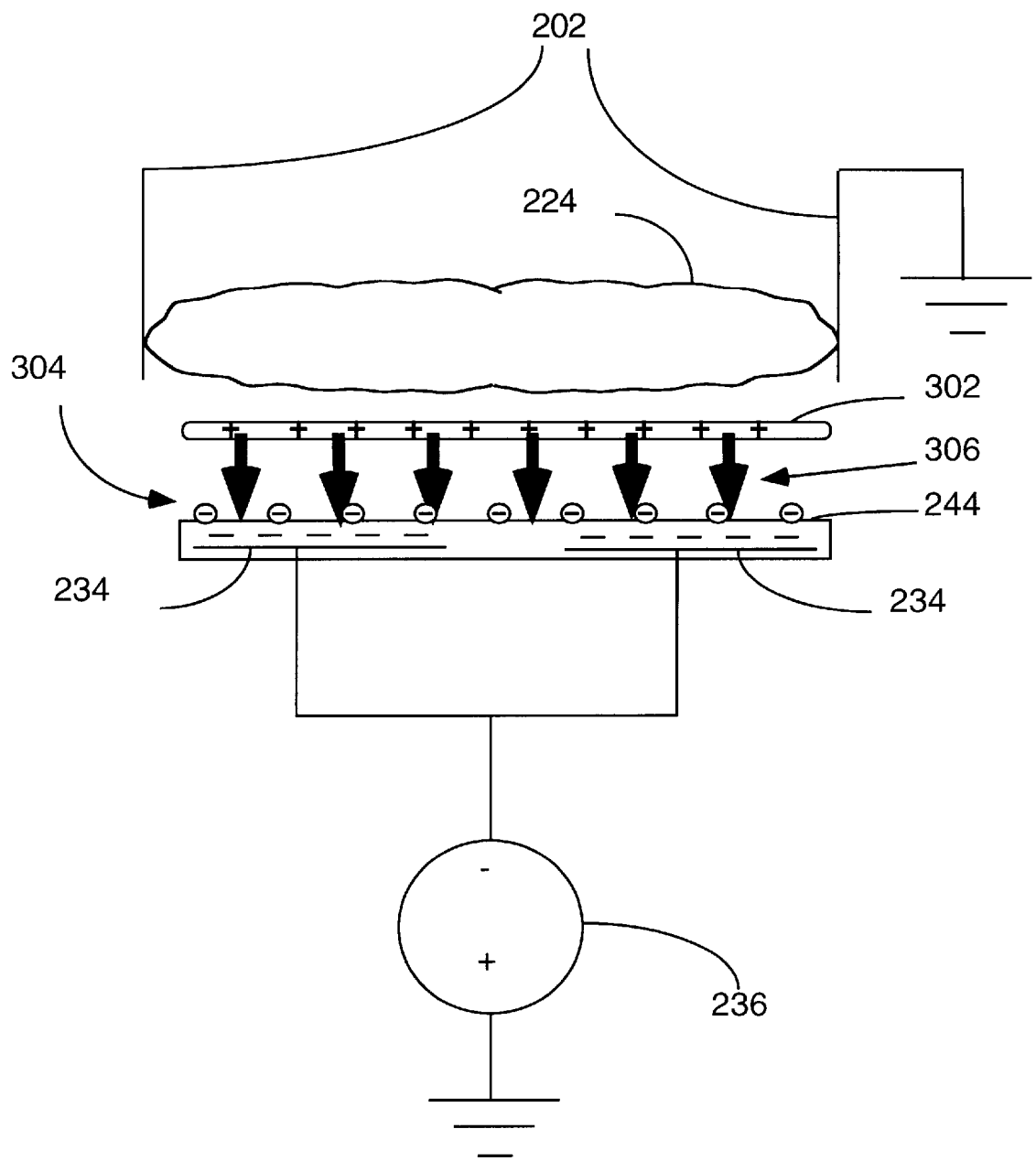
FIG. 3 is an exploded elevation view of an apparatus for implementing the subject method.

FIG. 3 depicts an exploded schematic of an apparatus for implementing the subject restoration method. The proportions and distances of objects in FIG. 3 have been greatly exaggerated for the sake of clarity in describing the invention and to clearly depict the interaction of the apparatus with chamber components. For example, negative charges 304 accumulate on the support surface 244 are much smaller than they appear. FIG. 1 is a flowchart depicting the steps for executing the subject restoration method 100. To more fully understand the subject method and apparatus, the reader is directed to view FIG. 3 in conjunction with FIG. 1.

The restoration method 100 starts at step 102. At step 104, a surrogate substrate 302 is placed on the support surface 244 of the electrostatic chuck 232 although it appears from FIG. 3 that the surrogate substrate 302 is not in contact with the support surface 244. Next, in step 106, the surrogate substrate 302 is connected to an electrical ground reference. The ground connection can be made by a variety of known or available methods. For example, in a first embodiment, the plasma 224 of FIG. 2 can be ignited above the surrogate substrate 302 which provides a conductive connection between the surrogate substrate 302 and the chamber walls 202 or other grounded chamber component. In a second embodiment, one end of a ground wire can be attached to the surrogate substrate 302 and another end can be attached to a grounded chamber component (i.e., the ground potential side of a power source, grounded lift pins placed in contact with the backside of the surrogate substrate 302 and the like). The aforesaid grounding methods are exemplary and are not meant to limit the scope of the present invention. In addition, the surrogate substrate 302 can be replaced with any type of conducting or semiconducting material capable of covering the support surface 244 of the chuck 232. For example, the surrogate substrate can be selected from the group consisting of a semiconductor wafer and a plate or sheet of metallic material.

With the grounded surrogate substrate 302 in place, step 108 is executed by creating a force between the surrogate substrate 302 and the support surface 244. In a preferred embodiment of the invention, the chuck 232 is subjected to a high power "treatment" electric field in monopolar mode. That is, switch 246 is moved to the "B" position so that the same polarity voltage is supplied to the chucking electrodes 234 via the high voltage power supply 236 or other such power supply. The high voltage power supply is capable of delivering a voltage (i.e., a "treatment" voltage) much greater than that ordinarily used during processing (i.e., for chucking) and is preferably in the range of approximately 2–5 KVDC. The circuit is completed by the surrogate substrate 302 that is in contact with ground. As such, a force in the form of a strong electric field (the "treatment" field denoted by arrows 306) is established between the support surface 244 and the backside of the surrogate substrate 302. This electric field 306 is highly uniform across the entire wafer/support surface interface and is strong enough to overcome the binding energy that holds the accumulated charges thereby driving them off the support surface 244, to the surrogate substrate 302 and to ground. Theoretical calculations have shown that the "treatment" electric field 306 generated is approximately 2–10 times and preferably 5 times greater than the electric field generated when chucking a wafer to the support surface 244. For example, a chucking voltage of approximately 400V DC generates an electric field strength of approximately 0.53 MV/cm and a "treatment" voltage 2 KV DC generates an electric field of approximately 2.6 MV/cm.

Additionally, experimentation has revealed that this magnitude electric field does drive these residual charges off the support surface. In addition, since an electric field is the only force being applied to the support surface, the support surface is not continually bombarded with more charged particles (i.e., from a "cleaning plasma" or the like) which can lead to etching of the support surface or implantation of the charges. The grounded surrogate substrate provides a pathway for the high power voltage source to drain accumulated charges and forms a shield against further interaction of the support surface with deleterious post process effects.

Figure 4:
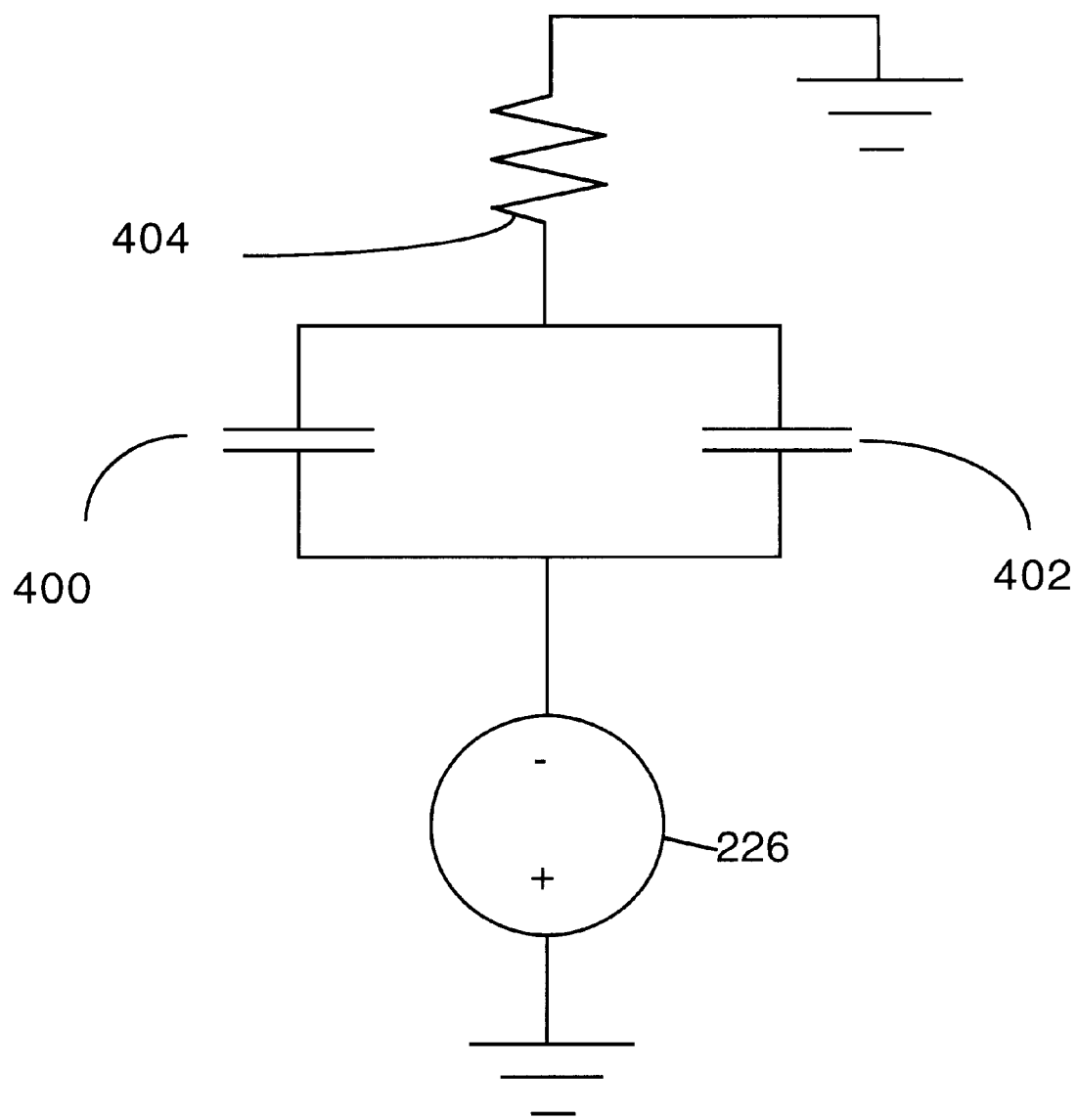
FIG. 4 is a representational circuit diagram of the apparatus and interacting chamber components during implementation of the subject method.

FIG. 4 depicts an electrical schematic of the circuit established by the subject apparatus and method. Specifically, high voltage power source 236 or the like is connected in monopolar configuration to chucking electrodes 234. Since mostly negative charges accumulate on the support surface during most wafer processing conditions, the high voltage power source has its negative terminal connected to the electrodes and its positive terminal to ground. The dielectric material insulating the electrodes as well as the small gap that exists between the support surface and the backside of the surrogate substrate creates a capacitance (approximately in the nanofarad range) at each electrode represented by capacitors 400 and 402. A resistor 404 represents the resistance naturally occurring in the ground connection and can include the resistivity of the wafer, ground wire, plasma or the like. The high voltage power supply is activated for a specific length of time that is predetermined. The predetermination is based on a variety of conditions including but not limited to the number of wafers processed, chucking voltage and the level of degradation of the chucking force and plasma conditions. In a preferred embodiment of the invention the duration of time is approximately 3 minutes. Alternately, the high voltage source can be pulsed (i.e., turned on and off) a predetermined number of times to effect accumulated charge removal. After the predetermined length of time, the high voltage power supply is turned off and the surrogate substrate 302 is removed from the chuck 232. Wafer processing then continues in the normal manner with a new wafer being introduced to the chamber 200. Optionally, another determination can be made as to how successful the restoration process was and whether the support surface 244 requires additional processing.

In sum, an electrostatic chuck support surface restoration process is described. Wafer processing parameters are monitored until such time that electrostatic chuck performance is determined to be below a nominal operating standard. At such time, a surrogate substrate is placed on the support surface of the electrostatic chuck and a connection to ground is established. The electrostatic chuck is then biased with a high power source for a predetermined time and at a specified power level. The "treatment" electric field established between the support surface and the surrogate substrate "pushes" any accumulated charges out of the support surface. The high power source is then turned off and the surrogate substrate removed. Optional monitoring or testing of chuck performance can be executed or wafer processing can resume. The described restoration process removes charges that become accumulated in the support surface due a variety of wafer process conditions. Removal of the accumulated charges reduces the likelihood of poor wafer processing conditions such as non-uniform temperature on the backside of the wafer, reduced chucking force on the wafer, increased dechucking force applied to the wafer and the like. The subject method also maintains the integrity of the support surface material as it is not subjected to the deleterious effects of highly energized and/or reactive species in a plasma.

Although various embodiments which incorporate the teachings of the present invention have been shown and described in detail herein, those skilled in the art can readily devise many other varied embodiments that still incorporate these teachings.

What is claimed is:

1. A method for restoring a support surface of a substrate support comprising the steps of:
   (a) providing a surrogate substrate on the support surface;
   (b) connecting the surrogate substrate to a ground; and
   (c) creating a force between the support surface and the surrogate substrate to remove accumulated charges in the support surface.

2. The method of claim 1 wherein the surrogate substrate is selected from the group consisting of a semiconductor wafer, a plate of metallic material and a sheet of metallic material.

3. The method of claim 1 wherein the step of connecting the surrogate substrate to ground further comprises striking a plasma that contacts the surrogate substrate and an electrical ground reference.

4. The method of claim 1 wherein the step of connecting the surrogate substrate to ground further comprises attaching a conductive wire to the surrogate substrate and an electrical ground reference.

5. The method of claim 1 wherein the step of creating a force between the support surface and the surrogate substrate further comprises energizing a power source connected to the substrate support to establish an electric field between the support surface and the surrogate substrate.

6. The method of claim 5 wherein the power source is capable of delivering a voltage in the range of approximately 25 KVDC.

7. The method of claim 6 wherein the voltage is delivered for a specific length of time.

8. The method of claim 7 wherein the specific length of time is approximately three minutes.

9. The method of claim 6 wherein the voltage is pulsed.

10. A method for removing accumulated charges in a support surface of an electrostatic chuck in a chamber, the method comprising the steps of:
    (a) providing the support surface having the accumulated charges;
    (b) disposing a surrogate substrate on the support surface;
    (c) connecting the surrogate substrate to a ground; and
    (d) establishing an electric field between the support surface and the surrogate substrate to drive the accumulated charges off the support surface.

11. The method of claim 10 wherein the surrogate substrate is selected from the group consisting of a semiconductor wafer, a plate of metallic material and a sheet of metallic material.

12. The method of claim 10 wherein the step of connecting the surrogate substrate to ground further comprises striking a plasma that contacts the surrogate substrate and a grounded chamber component.

13. The method of claim 10 wherein the step of connecting the surrogate substrate to ground further comprises attaching a conductive wire to the surrogate substrate and a grounded chamber component.

14. The method of claim 10 wherein the step of establishing an electric field between the support surface and the surrogate substrate further comprises energizing a power source connected to the electrostatic chuck.

15. The method of claim 14 wherein the power source is capable of delivering a voltage in the range of approximately 2–5 KVDC.

16. The method of claim 15 wherein the voltage is delivered for a specific length of time.

17. The method of claim 16 wherein the specific length of time is approximately three minutes.

18. The method of claim 15 wherein the voltage is pulsed.

19. Apparatus for restoring a support surface of an electrostatic chuck in a process chamber comprising:
    at least one grounded chamber component;
    a surrogate substrate disposed upon the support surface of the electrostatic chuck;
    a ground path defined between the surrogate substrate and the grounded chamber component; and
    a connection between the surrogate substrate and the support surface of the electrostatic chuck for removing accumulated charges in the support surface.

20. The apparatus of claim 19 wherein the connection between the surrogate substrate and the support surface is a high power DC power supply.

21. The apparatus of claim 20 wherein the ground path defined between the surrogate substrate and the grounded chamber component is a plasma contacting the surrogate substrate and the grounded chamber component.

22. The apparatus of claim 20 wherein the ground path defined between the surrogate substrate and the grounded chamber component is a ground wire attached to the surrogate substrate and the grounded chamber component.

* * * * *

UNITED STATES PATENT AND TRADEMARK OFFICE
CERTIFICATE OF CORRECTION

PATENT NO. : 6,099,697
DATED : August 8, 2000
INVENTOR(S) : Hausmann

It is certified that error appears in the above-identified patent and that said Letters Patent are hereby corrected as shown below:

In Claim 6, "25 KVDC" should be corrected to read: -- 2-5 KVDC --.

Signed and Sealed this

Seventeenth Day of April, 2001

Attest:

NICHOLAS P. GODICI

*Attesting Officer*   Acting Director of the United States Patent and Trademark Office